US00RE36179E

United States Patent [19]

Shimoda

[11] E Patent Number: Re. 36,179

[45] Reissued Date of Patent: Apr. 6, 1999

[54] SWITCHING CIRCUIT FOR SELECTING AN OUTPUT SIGNAL FROM PLURAL INPUT SIGNALS

[75] Inventor: Sadashi Shimoda, Tokyo, Japan

[73] Assignee: Seiko Instruments Inc., Japan

[21] Appl. No.: 325,815

[22] Filed: Oct. 19, 1994

Related U.S. Patent Documents

Reissue of:

[64] Patent No.: 5,157,291
Issued: Oct. 20, 1992
Appl. No.: 650,463
Filed: Feb. 4, 1991

[30] Foreign Application Priority Data

Feb. 13, 1990 [JP] Japan ..... 2-31862

[51] Int. Cl.[6] ..... H03K 5/24; H03K 17/693

[52] U.S. Cl. ..... 327/407; 327/70; 327/408; 327/434

[58] Field of Search ..... 327/70, 407–410, 327/434–437

[56] References Cited

U.S. PATENT DOCUMENTS 3,383,602 5/1968 Herman ..... 327/70
4,896,061 1/1990 Ahmed ..... 327/431

OTHER PUBLICATIONS

Patent Abstracts of Japan, vol. 5, No. 145 (E–74)(817), Sep. 12, 1981 (JP–A–51146152).

Patent Abstracts of Japan, vol. 1, No. 50, May 16, 1977, p. 3234 E'76 (JP–A–5678230).

*Primary Examiner*—David Mis
*Attorney, Agent, or Firm*—Adams & Wilks

[57] ABSTRACT

A switching circuit has input terminals, switching MOS transistors, and a control circuit having a control terminal. Diodes are connected between the respective input terminals and the control circuit. When input voltage (V1, V2) are applied to the input terminals, the output terminal is selectively put in either a fixed or a floating state according to the voltage applied to the control terminal.

31 Claims, 1 Drawing Sheet

SWITCHING CIRCUIT FOR SELECTING AN OUTPUT SIGNAL FROM PLURAL INPUT SIGNALS

Matter enclosed in heavy brackets [ ] appears in the original patent but forms no part of this reissue specification; matter printed in italics indicates the additions made by reissue.

BACKGROUND OF THE INVENTION

The present invention relates to a switching circuit of the monolithic IC type.

FIG. 2 shows a circuit diagram of the conventional switching circuit. Input terminals 1 and 2 receive different voltages V1 and V2, respectively. Either of the received voltages is outputted from an output terminal 5 through corresponding switching transistors 3 and 4. The voltages V1 and V2 are inputted into a comparator 6. The comparator 6 produces an output which is concurrently applied to a gate of the switching transistor 4 and to a gate of the other switching transistor 3 through an inverter 7.

In a condition where V1>V2, the comparator 6 produces an output having a high level so that the switching transistor 4 is turned off or placed in a non-conductive switching state. On the other hand, the output of the inverter 7 is held at a low level so that the other switching transistor 3 is turned on or placed on a conductive switching state. Consequently in this condition, the output terminal 5 provides the voltage V1. In a condition where V1<V2, the switching states of the switching transistors 3 and 4 are reversed so that the output terminal 5 provides the voltage V2. The comparator 6 and the inverter 7 are powered from the output terminal 5.

However, in this circuit construction, it is impossible to turn off both of the switching transistors so as to place the output terminal 5 in a floating state. The reason is that the switching transistor of the MOS type is structurally accompanied with a parasitic diode having an anode coupled to either of the input terminals 1 and 2 and a cathode coupled to the output terminal 5. Therefore, the output terminal 5 receives through the parasitic diode a voltage equal to the higher one of the input voltages minus the voltage drop across the parasitic diode. This voltage is effective to operate the comparator 6 and the inverter 7 to enable the same to turn on and off the switching transistors 3 and 4 to thereby constitute a current path having a voltage drop smaller than the voltage drop across the parasitic diode.

For the above described reason, the output terminal 5 necessarily provides the higher one of the voltages V1 and V2, thereby causing a problem that the floating state cannot be realized.

SUMMARY OF THE INVENTION

In order to solve the above noted problem of the prior art, an object of the present invention is to provide an improved switching circuit responsive to an external signal to place its output terminal in a floating state.

In realization of the aforesaid object, a pair of the switching transistors are integrated in the form of MOS transistors on a substrate, and their source region and drain region are electrically separated from the substrate. Further, a diode is formed between each of the input terminals and the substrate. Moreover, controlling circuits such as a comparator are powered through the substrate.

DETAILED DESCRIPTION OF EMBODIMENT

Figure 1:
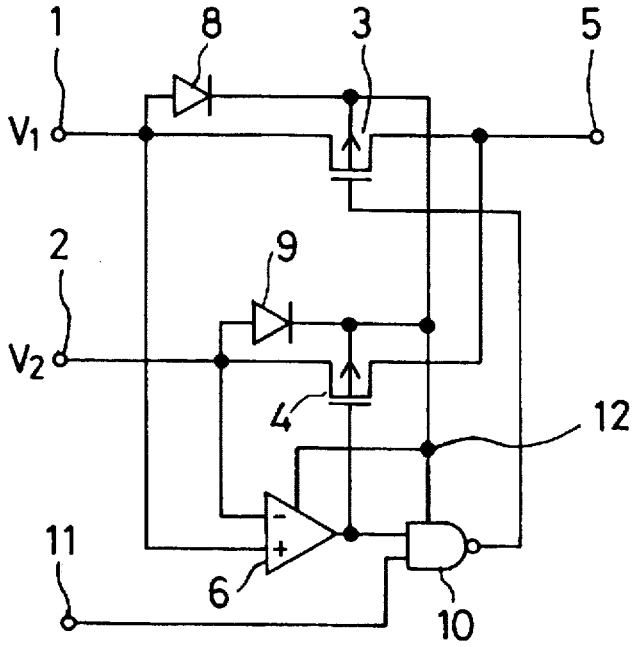
FIG. 1 is a circuit diagram of the inventive switching circuit.
Figure 2:
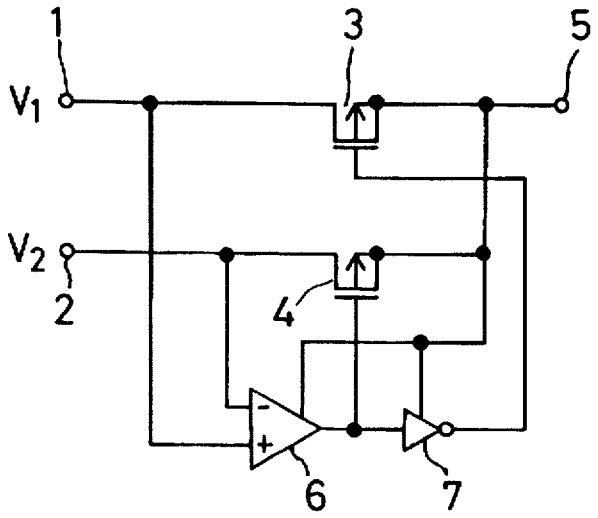
FIG. 2 PRIOR ART
FIG. 2 is a circuit diagram of the conventional switching circuit.

Hereinafter, an embodiment of the invention is described in detail with reference to the drawings. FIG. 1 shows a circuit diagram of the monolithic switching circuit according to the invention. A pair of input terminals 1 and 2 are connected to an output terminal 5 through switching transistors 3 and 4, respectively. The input terminals 1 and 2 are connected also to a comparator 6 in manner similar to the conventional circuit. According to the invention, advantageously both the source and drain regions of the switching transistors 3 and 4 are electrically separated from a substrate on which the switching transistors 3 and 4 are formed. Further, the substrate is connected to a diode 8 having an anode coupled to the input terminal 1, and the substrate is also connected to another diode 9 having an anode coupled to the input terminal 2. Moreover, the substrate is also connected to a power supply line which is connected to *a power source terminal 12 connected to* the comparator 6 and a gate circuit 10. The gate circuit 10 has one input terminal connected to a control terminal 11 receptive of a control signal and another input terminal connected to an output terminal of the comparator 6. The comparator 6, gate circuit 10 and control terminal 11 comprise a control circuit which, as described below, controls the switching states of the switching transistors 3, 4.

In operation, when voltages V1 and V2 are applied to the input terminals 1 and 2, respectively, the comparator 6 and the gate circuit 10 are placed in the operative state since electric power is supplied thereto through the diodes 8 and 9, respectively. At this time, the supplied electric power source voltage *applied to the power source terminal 12* is equal to the higher one of the voltages V1 and V2 minus a voltage drop developed across the corresponding diode. Then, the comparator 6 and gate circuit 10 operate according to the relative magnitude difference between the pair of voltages V1 and V2 to selectively turn on and off the switching transistors 3 and 4. In such operation, the control terminal 11 must be held at the high level.

On the other hand, when the control terminal 11 is switched to the low level, the output of the gate circuit 10 is turned to the high level so that the switching transistor 3 is turned off. If the condition V1>V2 is held at this time, the other switching transistor 4 is also turned off to thereby place the output terminal 5 in the floating state.

The inventive switching circuit can be constructed in the form of a monolithic IC integrated with all of the components including a comparator, a gate circuit and diodes, in the form of MOS transistors. Further, the diode is preferable composed of a Shottky barrier diode having a relatively small voltage drop in the forward direction in order to improve performance of the switching circuit.

As described above, according to the present invention, a diode is formed between each input terminal and a substrate in which the switching transistor is integrated in the form of a MOS transistor, and control circuits such as a comparator are powered through the substrate. By such a construction, the pair of switching transistors can be concurrently turned off in response to an external control signal so as to place the output terminal in the floating state in the switching circuit.

What is claimed is:

1. A switching circuit for selecting an output signal from a plurality of input signals, comprising: a plurality of input terminals; an output terminal; a plurality of switching devices; a control circuit having a control terminal and a plurality of unidirectionally conductive devices connected between respective ones of the input terminals and the control circuit so that in operation, when voltages are applied to the input terminals, the output terminal is selectively put in a fixed or a floating state according to the voltage applied to the control terminal.

2. A switching circuit for selecting an output signal from a plurality of input signals as claimed in claim 1; wherein the switching devices comprise MOS transistors.

3. A switching circuit for selecting an output signal from a plurality of input signals as claimed in claim 1; wherein the unidirectionally conductive devices comprise diodes.

4. A switching circuit from selecting an output signal from a plurality of input signals as claimed in claim 1; wherein the unidirectionally conductive devices are connected between respective ones of the input terminals and a substrate on which are formed the plurality of switching devices.

5. A switching circuit for selecting an output signal from a plurality of input signals as claimed in claim 4; wherein the [unidirectionally conductive devices comprise diodes] *switching devices comprise MOS transistors.*

6. A switching circuit for selecting an output signal from a plurality of input signals as claimed in claim 4; wherein the unidirectionally conductive devices comprise diodes.

7. A switching circuit comprising: plural input terminals to which are applied respective input signals during use of the switching circuit; an output terminal; plural switching means having conductive and non-conductive switching states for selectively switching the input signals to the output terminal; and control circuit means including a control terminal to which a control signal is applied during use of the switching circuit and operative when the control signal has a first voltage level for controlling the switching states applied to the input terminals to thereby place the output terminal in a fixed state corresponding to one of the input signals and operative when the control signal has a second voltage level for placing all the switching means in the non-conductive switching state to thereby place the output terminal in a floating state which is independent of the input signals.

8. A switching circuit according to claim 7; wherein all the switching means comprise electronic switching devices.

9. A switching circuit according to claim 8; wherein the electronic switching devices comprise MOS transistors.

10. A switching circuit according to claim 9; including plural unidirectionally conductive devices connected between respective ones of the input terminals and the control circuit means.

11. A switching circuit according to claim 10; wherein the unidirectionally conductive devices comprise diodes.

12. A switching circuit according to claim 9; including plural unidirectionally conductive devices connected between respective ones of the input terminals and a substrate on which are formed the MOS transistors.

13. A switching circuit according to claim 7; including plural unidirectionally conductive devices connected between respective ones of the input terminals and the control circuit means.

14. A switching circuit according to claim 13; wherein the unidirectionally conductive devices comprise diodes.

15. A switching circuit according to claim 13; wherein the control circuit means comprises a comparator having plural inputs connected to respective ones of the input terminals and an output, and a gate circuit having two inputs, one connected to the comparator output and the other connected to the control terminal, and an output connected to one of the switching means.

16. A switching circuit according to claim 7; wherein the control circuit means comprises a comparator having plural inputs connected to respective ones of the input terminals and an output, and a gate circuit having two inputs, one connected to the comparator output and the other connected to the control terminal, and an output connected to one of the switching means.

*17. A switching circuit for selecting an output signal from a plurality of input signals, comprising: plural input terminals to which are applied respective input signals during use of the switching circuit; an output terminal; plural switching devices having conductive and non-conductive switching states for selectively switching the input signals to the output terminal; control circuit means for controlling the switching devices; and plural diodes each having an anode coupled to a respective one of the input terminals and a cathode coupled to a power source terminal of the control circuit means.*

*18. A switching circuit for selecting an output signal from a plurality of input signals as claimed in claim 17; wherein the control circuit means comprises a comparator having plural inputs connected to respective ones of the input terminals.*

*19. A switching circuit for selecting an output signal from a plurality of input signals as claimed in claim 17; wherein the switching devices comprise MOS transistors.*

*20. A switching circuit for selecting an output signal from a plurality of input signals as claimed in claim 19; wherein the MOS transistors each comprise a gate electrode connected to an output of the control circuit means, a source region connected to one of the input terminals, and a drain region connected to the output terminal.*

*21. A switching circuit for selecting an output signal from a plurality of input signals as claimed in claim 20; including a substrate on which the MOS transistors are formed; and wherein the cathodes of the diodes are connected to the substrate.*

*22. A switching circuit for selecting an output signal from a plurality of input signals as claimed in claim 17; wherein the control circuit means has a control terminal receptive of a voltage signal which enables the control circuit means to place the output terminal in a fixed voltage state or a floating voltage state according to the level of the voltage signal.*

*23. A switching circuit for selecting an output signal from a plurality of input signals, comprising: plural input terminals to which are applied respective input signals during use of the switching circuit; an output terminal; plural switching means having conductive and non-conductive switching states for selectively switching the input signals to the output terminal; control circuit means for controlling the switching means; and a plurality of unidirectionally conductive devices connected between respective ones of the input terminals and the control circuit means.*

*24. A switching circuit for selecting an output signal from a plurality of input signals as claimed in claim 23; wherein the control circuit means comprises a comparator having plural inputs each connected to a respective one of the input terminals.*

*25. A switching circuit for selecting an output signal from a plurality of input signals as claimed in claim 23; wherein the unidirectionally conductive devices comprise diodes.*

*26. A switching circuit for selecting an output signal from a plurality of input signals as claimed in claim 25; wherein each diode has an anode connected to a respective one of the input terminals and a cathode connected to a substrate on which are formed the plurality of switching means.*

*27. A switching circuit for selecting and output signal from a plurality of input signals as claimed in claim 26;*

*wherein the plural switching means comprise MOS transistors formed on the substrate.*

*28. A switching circuit for selecting an output signal from a plurality of input signals as claimed in claim 27; wherein each of the MOS transistors comprises a gate electrode connected to the control circuit means, a source region connected to one of the input terminals, and a drain region connected to the output terminal.*

*29. A switching circuit for selecting an output signal from a plurality of input signals as claimed in claim 26; wherein the control circuit means has a power terminal connected to the cathodes of the diodes.*

*30. A switching circuit for selecting an output signal from a plurality of input signals as claimed in claim 23; wherein the control circuit means has a power terminal connected to the unidirectionally conductive devices for powering the control circuit means through the unidirectionally conductive devices.*

*31. A switching circuit for selecting an output signal from a plurality of input signals as claimed in claim 30; wherein the control circuit means includes a control terminal to which a voltage signal is applied so that in operation of the switching circuit, when voltages are applied to the input terminals, the output terminal is selectively placed in a fixed voltage state or a floating voltage state according to the level of the applied voltage signal.*

* * * * *